United States Patent [19]

Kiewit

[11] Patent Number: 4,876,736
[45] Date of Patent: Oct. 24, 1989

[54] METHOD AND APPARATUS FOR DETERMINING CHANNEL RECEPTION OF A RECEIVER

[75] Inventor: David A. Kiewit, Palm Harbor, Fla.

[73] Assignee: A. C. Nielsen Company, Northbrook, Ill.

[21] Appl. No.: 100,198

[22] Filed: Sep. 23, 1987

[51] Int. Cl.$^4$ ............................................. H04B 17/00
[52] U.S. Cl. ........................................ 455/2; 455/151; 358/84; 379/92
[58] Field of Search .................... 455/2, 4, 151, 601, 455/603; 358/84, 86, 93; 379/92; 340/825.69, 825.72

[56] References Cited

U.S. PATENT DOCUMENTS

| | | |
|---|---|---|
| 3,619,783 | 11/1971 | Ritter et al. . |
| 3,947,624 | 3/1976 | Miyake . |
| 4,025,851 | 5/1977 | Haselwood et al. ............. 358/84 X |
| 4,425,578 | 1/1984 | Haselwood et al. ................ 358/84 |
| 4,495,654 | 1/1985 | Deiss .................................. 455/151 |
| 4,577,220 | 3/1986 | Laxton et al. ......................... 358/84 |
| 4,605,958 | 8/1986 | Machnik et al. ...................... 358/84 |
| 4,644,393 | 2/1987 | Smith et al. ........................... 358/84 |
| 4,646,145 | 2/1987 | Percy et al. ......................... 455/2 X |
| 4,658,290 | 4/1987 | McKenna et al. .................. 455/2 X |
| 4,723,302 | 2/1988 | Fulmer et al. ........................... 455/2 |

FOREIGN PATENT DOCUMENTS 2608508 9/1977 Fed. Rep. of Germany ........ 358/84

Primary Examiner—Robert L. Griffin
Assistant Examiner—Ralph Smith
Attorney, Agent, or Firm—Mason, Kolehmainen, Rathburn & Wyss

[57] ABSTRACT

A method and apparatus are provided for determining the channel of a plurality of predetermined channels to which a remotely controlled receiver is tuned. A first transmitter device includes a keyboard for receiving viewer entered selections and transmits infrared or ultrasonic control signals for each of the viewer tuning and ON/OFF selections. A receiver device receives the transmitted control signal from the first transmitter and applies the received signal to a processor device that performs a stored program to identify the channel to which the monitored receiver is tuned. An associated memory device is used for storing the identified channel reception data. The processor device identifies the user selection and applies a corresponding second control signal to a second transmitter device. The second transmitted control signals have a predetermined format of the existing remote control receiver of the monitored receiver that is different than a predetermined format of the control signals of the first transmitter device.

38 Claims, 4 Drawing Sheets

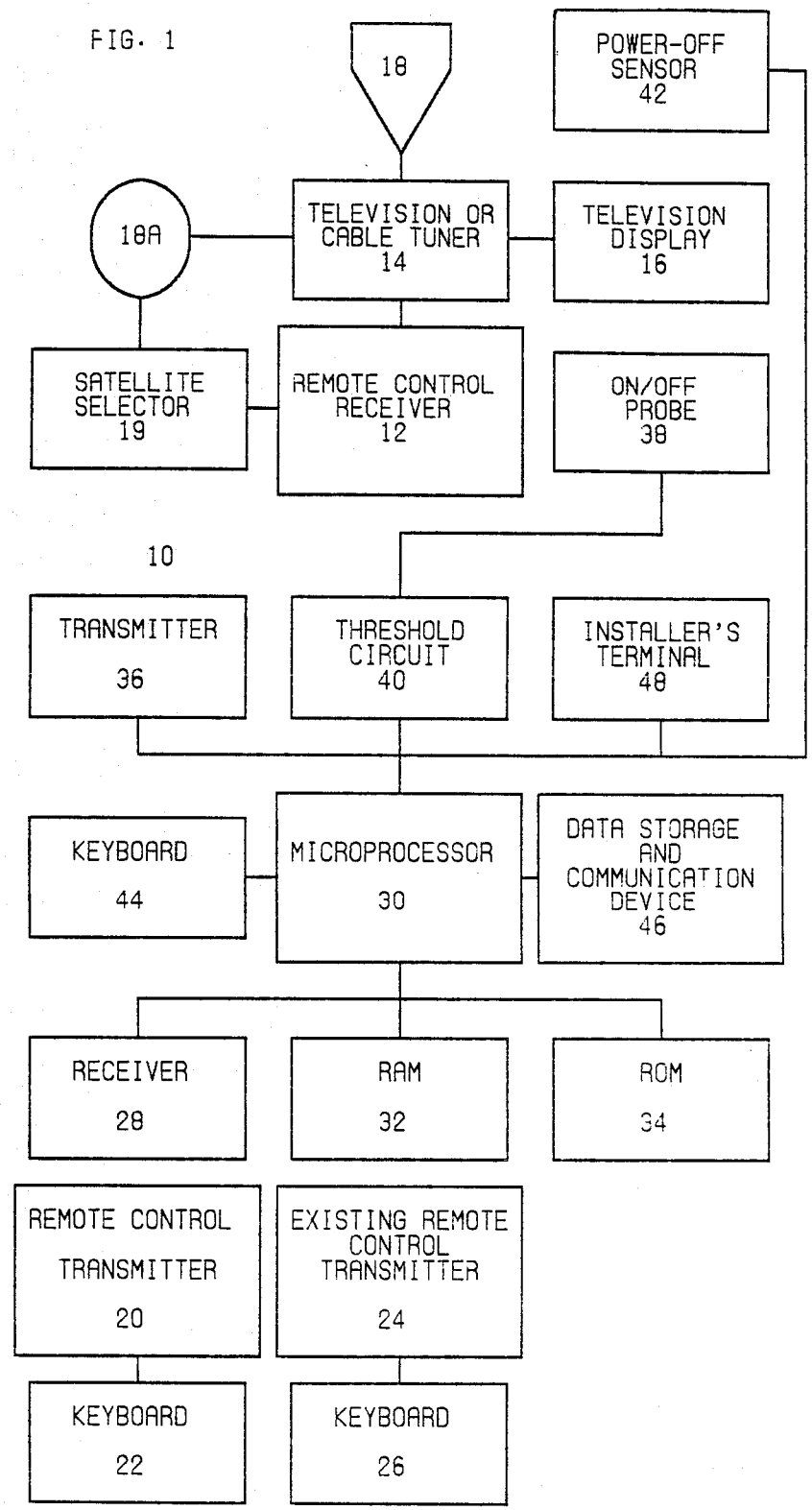

METHOD AND APPARATUS FOR DETERMINING CHANNEL RECEPTION OF A RECEIVER

BACKGROUND OF THE INVENTION

A. Field of the Invention

This invention relates generally to a method and apparatus for monitoring a receiver to determine the channel to which a receiver is tuned, and more particularly to a method and apparatus for determining the channel reception of a remotely controlled receiver.

B. Description of the Prior Art

Various arrangements have been employed to determine the channel to which a television receiver is tuned. A disadvantage of many known monitoring arrangements is that an internal connection to the television receiver is required. For example, Haselwood et al. U.S. Pat. No. 3,973,206, issued on Aug. 3, 1976 discloses a method of determining channel tuning by monitoring the varactor diode tuning voltage and thus, required internal connections in the television receiver.

Another method for determining channel tuning disclosed in Haselwood et al. U.S. Pat. No. 4,425,578, issued on Jan. 10, 1984 utilizes a signal injection source and a detector/receiver arranged to detect the combined signal from the injection signal source and a video carrier to which the video receiver is tuned. A significant drawback of signal injection monitoring arrangements is the potential interference with the functional operation of the video receiver being monitored.

U.S. patent application Ser. No. 893,183 to Fulmer et al., filed on Aug. 5, 1986, now U.S. Pat. No. 4,723,302 and assigned to the same assignee as the present application, discloses another method for determining channel tuning utilizing a local oscillator frequency measurement of the monitored receiver. The disclosed method and apparatus while effective for its intended purpose generally requires that a probe be positioned at a selected location in the monitored receiver and thus, requires physical access to the receiver.

Access to the tuning mechanism is becoming increasingly difficult with the advent of cable and pay television systems that utilize various converters and decoders, many of which are difficult to access.

Often a remote control system is used with the receiver enabling remote operation by a viewer for channel selection and turning the receiver ON and OFF. Additionally, remote control systems generally are available with cable tuners. Due to the increasing use of remote control systems with various receivers, such as broadcast radio receivers and video cassette recorders and cable converters used with a television receiver, at least one commercially available transmitter device, such as a General Electric device Model RRC600 Consumer Control Center, is used for remotely controlling multiple receivers. The RRC600 transmitter device learns and stores the infrared control signals used in various existing remote control systems of multiple devices so that this single transmitter is used instead of a separate transmitter for each remotely controlled device.

SUMMARY OF THE INVENTION

Accordingly, it is an important object of the present invention to provide a method and apparatus for determining the channel of a plurality of predetermined channels to which a receiver is tuned that overcome many of the disadvantages of prior art systems. Other principle objects of the present invention are to provide such improved method and apparatus that accurately identifies the channel reception of a remotely controlled receiver and without requiring physical access to the monitored receiver and to provide such improved method and apparatus to determine both the channel reception and a selected broadcast satellite of a remotely controlled receiver.

In brief, these and other objects and advantages of the invention are provided by a method and apparatus for determining the channel of a plurality of predetermined channels to which a remotely controlled receiver is tuned. A first transmitter device includes a keyboard for receiving viewer entered selections and transmits infrared or ultrasonic control signals for each of the viewer tuning and ON/OFF selections. A receiver device receives the transmitted control signal from the first transmitter and applies the received signal to a processor device that performs a stored program to identify the channel to which the monitored receiver is tuned. An associated memory device is used for storing the identified channel reception data. The processor device identifies the user selection and applies a corresponding second control signal to a second transmitter device. The second transmitted control signals have a predetermined format of the existing remote control receiver of the monitored receiver that is different than a predetermined format of the control signals of the first transmitter device.

DESCRIPTION OF THE DRAWING

These and other objects and advantages of the present invention will become readily apparent upon consideration of the following detailed description and attached drawing wherein:

FIG. 1 is a block diagram of the channel detection apparatus according to the present invention.

DETAILED DESCRIPTION OF THE PREFERRED EMBODIMENT

Figure 2A:
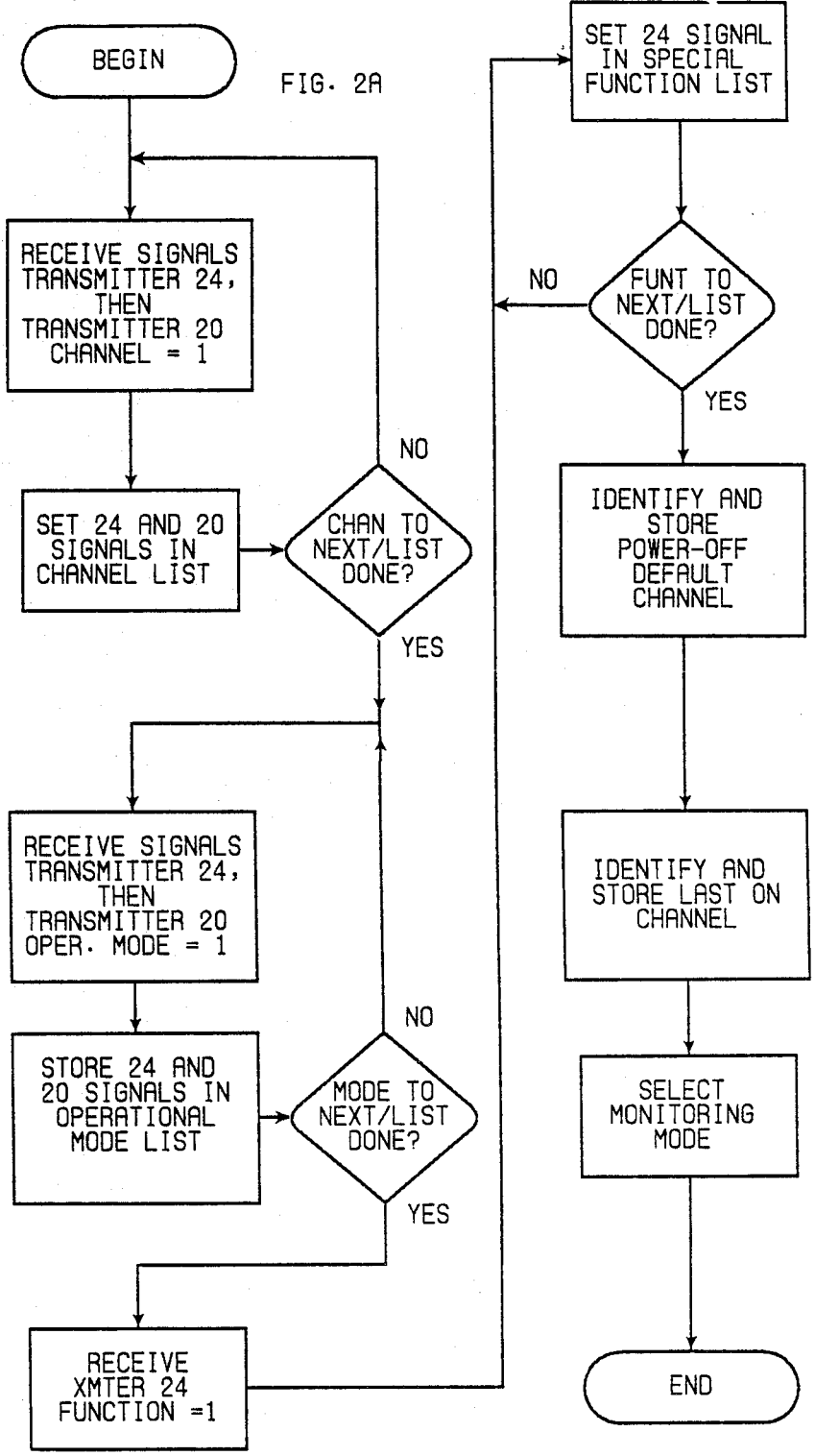
FIGS. 2A–2C are flow charts illustrating the logical steps performed by the apparatus of FIG. 1.

Referring now to the drawing, with particular attention to FIG. 1, there is illustrated a block diagram of a new and improved channel detection apparatus according to the invention generally designated by the reference numeral 10. While the channel detection apparatus 10 is depicted and generally described herein for monitoring a television receiver, the principles of the present invention are also applicable to broadcast radio receivers, video cassette recorders and other receivers.

An existing remote control receiver 12 receives transmitted control signals for controlling a tuner 14 that may be an internal television tuner or an external cable tuner used in conjunction with a television display 16. A signal source 18 is connected to the television tuner 14, such as, for example, a receiving antenna or a television cable system. Alternatively, a satellite antenna 18A used in conjunction with a satellite selector 19 provides a selected broadcast satellite signal to the television tuner 14. The satellite selector 19 is controlled by the remote control receiver 12 for aiming the satellite antenna 18A at a particular one of a plurality of broadcasting satellites. The channel detection apparatus 10 includes a first remote control transmitter 20 that includes a keyboard 22 for receiving viewer tuning and ON/OFF selections. An existing transmitter 24 having a keyboard 26, originally provided for use with the remote control receiver 12, is used for an initialization procedure when the channel detection apparatus 10 is first installed. The initialization procedure is described with respect to FIG. 2A.

A remote control receiver 28 of the channel detection apparatus 10 receives the transmitted control signals from the transmitters 20 and 24 during the initialization procedure. During normal monitoring operation of the channel detection apparatus 10, the receiver 28 receives the transmitted control signals from the transmitter 20 and the existing transmitter 24 is not used. A processor device such as a microprocessor 30 receives the control signals from the remote control receiver 28. Associated memory devices, such as a random access memory RAM 32 for data storage, and a read only memory ROM 34 for program storage are used in conjunction with the microprocessor 30. Various commercially available microprocessor devices can be utilized for the microprocessor 30, such as an eight-bit Motorola microprocessor device HCMOS MC68HC11. The MC68HC11 microprocesor 30 includes a programmable timer system that advantageously can be used to maintain a real time reference for storing with the channel reception data. On-chip peripheral functions including a serial communications interface (SCI) subsystem and an 8-channel analog-to-digital (A/D) converter are provided by MC68HC11 microprocessor 30.

The channel detection apparatus 10 includes a second remote control transmitter 36 coupled to the microprocessor 30 for transmitting control signals having a predetermined format of the existing transmitter 24 for controlling the tuner 14. An ON/OFF probe 38 is used for monitoring the ON/OFF operational modes of the monitored television including the tuner 14 and the display 16. Various conventional detectors can be employed for the ON/OFF probe 38, for example, the probe 38 may include tuned circuitry for detecting a characteristic frequency of the horizontal retrace oscillator in the television display 16. An ON/OFF threshold circuit 40 is used in conjunction with the ON/OFF probe 38 to provide a signal to the microprocessor 30 corresponding to the ON and OFF operational functions of the television 16.

A power-off probe 42 of the channel detection apparatus 10 provides a signal to the microprocessor 30 indicative of the monitored television tuner 14 being disconnected from the power source or other power outage. When the television is turned ON after power is restored to the monitored tuner 14, a default channel is initially tuned by the tuner 14. Thus the signal of power-off probe 42 is utilized by the microprocessor 30 to accurately identify this initial channel reception.

The channel detection apparatus 10 further includes a keyboard 44 coupled to the microprocessor 30 for manual operation by the viewer. The keyboard 44 is used instead of an existing keyboard (not shown) typically included with the television tuner 14. In response to a viewer entry made by way of the keyboard 44, the microprocessor 30 applies the corresponding control signals to the transmitter 36 for controlling the tuner 14. The channel reception is identified for a viewer selection entry via keyboard 44 by the same logical steps performed by the microprocessor 30 as for an entry via transmitter 20.

A data storage and communication device 46 takes the data from the microprocessor 30 via one of various known communication methods and stores the data for subsequent retrieval, usually via a telephone line connected to the public switched telephone network, by a central computer (not shown). A terminal 48 is coupled to the microprocessor 30 for use during the installation procedure and for testing.

The operation of the channel detection apparatus 10 will now be described with reference to the flow charts shown in FIGS. 2A-2C. Referring first to FIG. 2A, the logical steps performed by the microprocessor 30 during the initialization procedure is illustrated. The initialization procedure includes sequentially correlating and storing corresponding entry selections via the existing transmitter 24 and the first transmitter 20 for each of possible viewer selections. A first predetermined control signal format of the existing transmitter 24 is stored with a different predefined control signal format of the transmitter 20 for each of the channels that may be received by the television receiver. The corresponding control signal pairs of two different formats are sequentially stored to form a channel list.

When a satellite antenna 18A and associated satellite selector 19 are used with the television receiver, then the corresponding control signal pairs are sequentially stored to form a broadcast satellite list.

Next the user entry selections for controlling the ON/OFF operational mode of the monitored receiver are sequentially entered and the resulting control signals transmitted by the transmitters 24 and 20 are correlated and stored as a corresponding signal pair to form an operational mode list.

Then special user entry selections, such as channel scan up and down, are sequentially entered using only the transmitter 20 and the resulting control signals of the transmitter 20 are stored as to form a special function list. The corresponding channel scan up and down control signal of the transmitter 24 are not stored because these signals cause the television tuner 14 to scan toward a higher or lower channel number until a video signal is found on a receivable channel. Use of such control signals could result in channel reception identification errors by the channel detection apparatus 10. Each of the corresponding viewer selections entered via the keyboard 44 are identified and stored with corresponding signal pairs of the channel list and operational mode list and with the corresponding signals of the special function list.

Next the default channel tuned by the tuner 14 after a power loss is identified and stored. Then one of the predetermined channels of the tuner 14 is entered as a viewing selection and the channel reception is stored as the last on channel. Finally, the monitoring mode of the channel detection apparatus 10 is selected and the initialization procedure is completed.

Figure 2B:
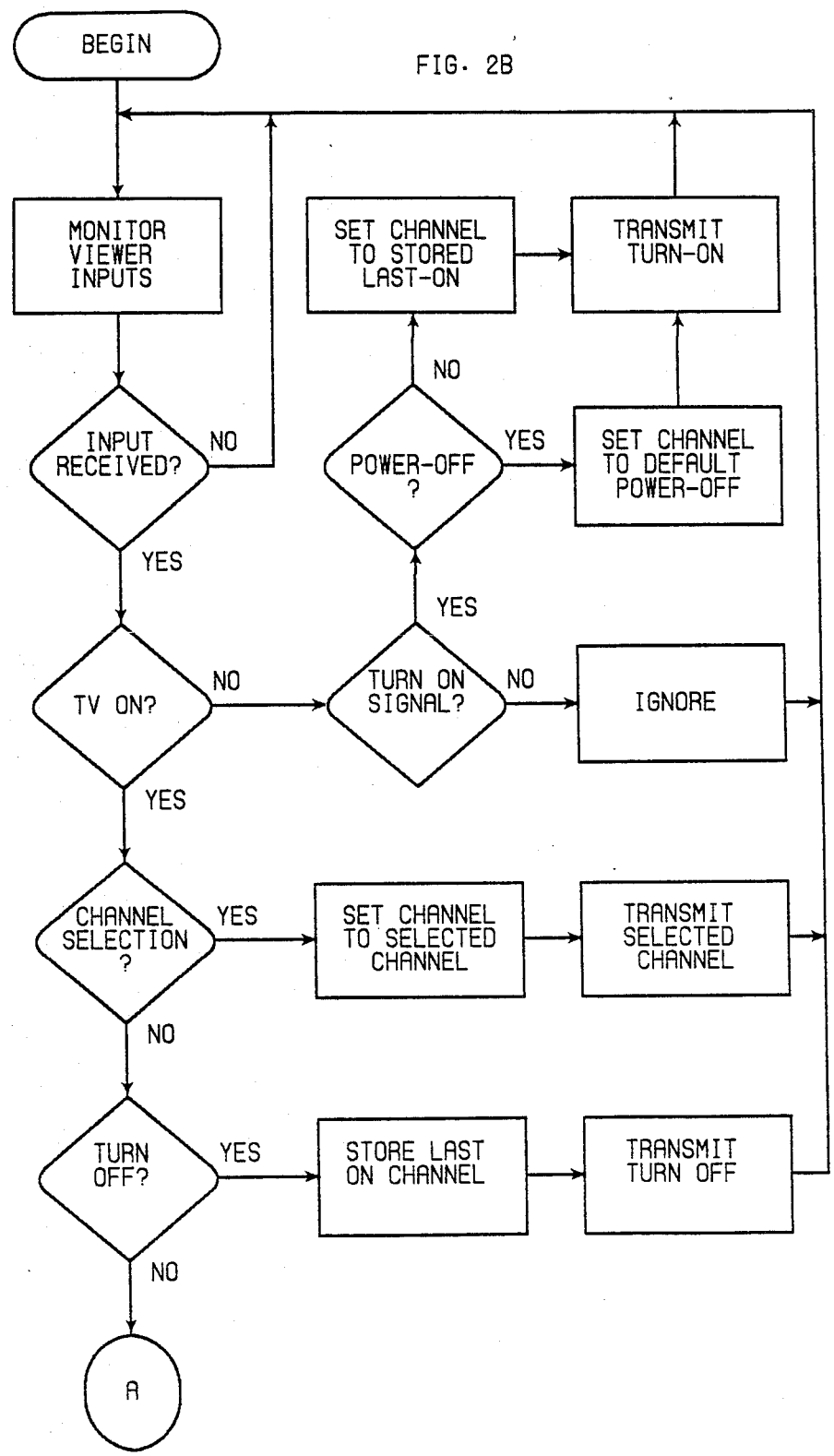
Figure 2C:
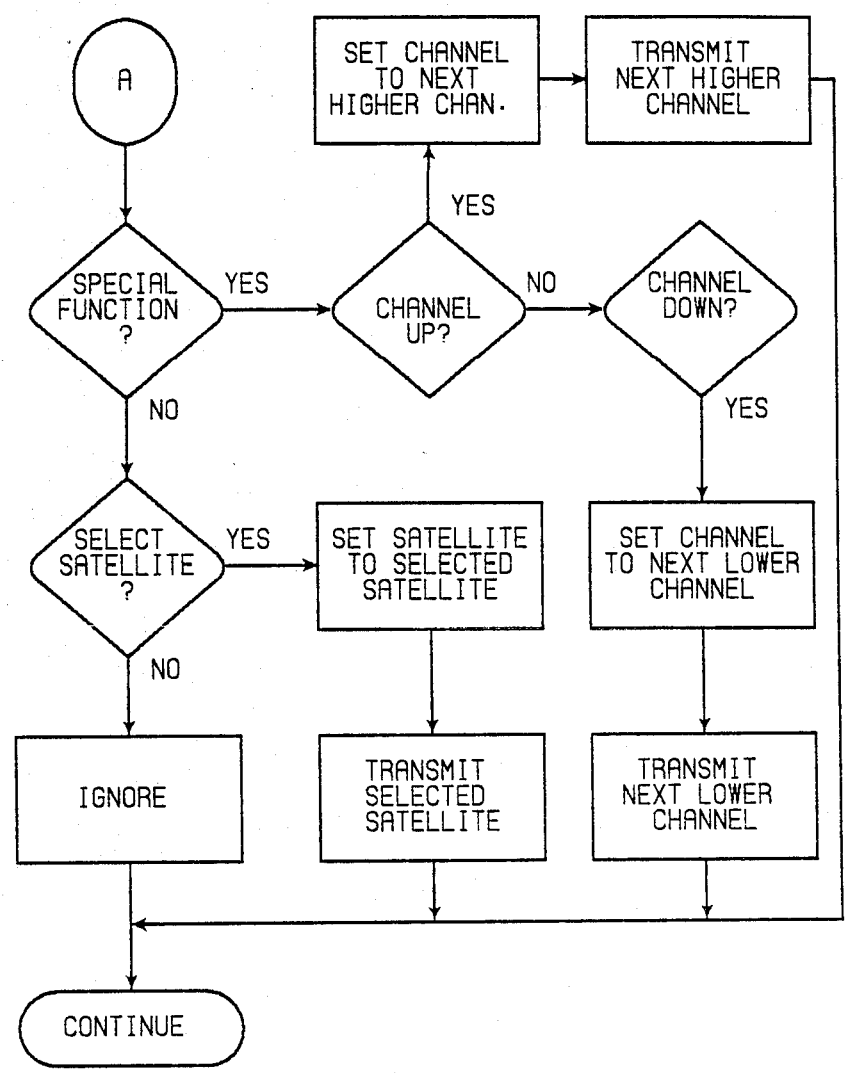

Referring to FIGS. 2B-2C, there is illustrated the logical steps performed by the microprocessor 30 during the monitoring operation by the channel detection apparatus 10. The microprocessor 30 monitors the signals from both the remote control receiver 28 and the keyboard 44 to identify viewer selections. When a viewer selection is detected, the microprocessor 30 monitors the ON/OFF signal applied by the ON/OFF threshold circuit 40 to determine if the television is ON.

When the television is OFF, the detected viewer selection is compared with the stored turn ON signal of the transmitter 20 or the keyboard 44 depending on the source of the detected signal. When a match is found corresponding to an entered turn ON selection by the viewer, the microprocessor 30 monitors the power-off probe 42 to determine if a power loss has occurred prior to the detected turn ON selection. When a power loss to the monitored receiver is indicated, the channel reception is set to the stored power-off default channel. Otherwise, when a power loss is not indicated, the channel reception is set to the stored last on channel. Then the corresponding stored turn ON signal of the transmitter 24 is applied by the microprocessor 30 to the transmitter 36 for transmitting to the remote control receiver 12. Otherwise, when the compared signals do not match, the detected signal is ignored. The microprocessor 30 continues to monitor the signals from the receiver 28 and the keyboard 44.

When the television is ON, the detected viewer selection is compared with the stored channel selection signals of the transmitter 20 or the keyboard 44 of the channel list. When a match is found corresponding to an entered channel selection by the viewer, the channel reception is set to the thus identified channel from the channel list. Then the stored corresponding signal of the transmitter 24 is applied by the microprocessor 30 to the transmitter 36 for transmitting to the remote control receiver 12. The microprocessor 30 continues to monitor the signals from the receiver 28 and the keyboard 44.

Otherwise when a match is not found in the channel list, then the detected viewer selection is compared with the stored turn OFF signals in the operational mode list of the transmitter 20 or the keyboard 44 depending on the source of the detected signal. When a turn OFF viewer selection is identified, the current channel reception is stored as the last on channel. Then the corresponding stored turn OFF signal is applied to the transmitter 36 by the microprocessor 30. The microprocessor 30 continues to monitor the signals from the receiver 28 and the keyboard 44.

When a turn OFF viewer selection is not identified, the detected viewer selection signal is compared with the special function list starting, for example, with the channel-up viewer selection. If the channel-up user selection is identified, the channel reception is set to the next higher channel than the current set channel. The corresponding control signal is applied to the transmitter 36 for transmitting to the remote control receiver 12. Then the microprocessor 30 continues to monitor the signals from the receiver 28 and the keyboard 44.

When the detected viewer selection signal does not match the channel-up viewer selection, then it is compared with the next entry within the special function list, for example, the channel-down viewer selection. If the channel-down user selection is identified, the channel reception is set to the next lower channel than the current set channel. Then the corresponding control signal is applied to the transmitter 36 for transmitting to the receiver 12. The microprocessor 30 continues to monitor the signals from the receiver 28 and the keyboard 44.

After comparing the detected viewer selection signal with the last entry of the special function list without finding a match, then the detected viewer selection is compared with the stored satellite selection signals within the broadcast satellite list. When a match is found corresponding to an entered satellite selection by the viewer, the satellite reception is set to the thus identified broadcast satellite. Then the stored corresponding signal of the transmitter 24 is applied by the microprocessor 30 to the transmitter 36 for transmitting to the remote control receiver 12. Then the microprocessor 30 continues to monitor the signals form the receiver 28 and the keyboard 44.

Otherwise when a match is not found, then the detected viewer selection signal is ignored. Then the microprocessor 30 continues to monitor the signals from the receiver 28 and the keyboard 44.

Although the present invention has been described in connection with details of the preferred embodiment, many alterations and modifications may be made without departing from the invention. Accordingly, it is intended that all such alterations and modifications be considered as within the spirit and scope of the invention as defined in the appended claims.

What is claimed and desired to be secured by Letters Patent is:

1. Apparatus for identifying the channel to which a remotely controlled receiver is tuned comprising:
   first wireless transmitter means for receiving a plurality of viewer entered selections and for transmitting a first unique predetermined control signal for each of said viewer entered selections;
   receiver means for receiving said transmitted first predetermined control signals;
   processor means coupled to said receiver means for processing said first received predetermined control signals, said processor means including means for identifying said viewer entered selection, and means for generating a second unique predetermined control signal representative of said identified viewer entered selection; and
   second wireless transmitter means coupled to said processor means for receiving said generated second predetermined control signal and transmitting a representation thereof to said remotely controlled receiver to thereby tune the receiver.

2. Apparatus as recited in claim 1 further comprising means coupled to said processor means for storing said viewer identified selection.

3. Apparatus as recited in claim 2 wherein said processor means further comprises
   means for identifying a current time reference, and
   means for storing said identified current time reference with said viewer identified selection.

4. Apparatus as recited in claim 2 further comprising
   means coupled to said processor means for communicating with a central computer to transfer said stored viewer identified selection.

5. Apparatus as recited in claim 1 wherein said processor means further includes
   means responsive to said identified viewer entered selection to identify a selected satellite from a plurality of broadcasting satellites.

6. Apparatus as recited in claim 1 further comprising keyboard means coupled to said processor means for receiving said plurality of viewer entered selections.

7. Apparatus as recited in claim 1 wherein said remotely controlled receiver is a television cable tuner.

8. Apparatus as recited in claim 1 wherein said remotely controlled receiver is a television tuner.

9. Apparatus as recited in claim 1 wherein said processor means further includes
   means for storing each of said first and second unique predetermined control signals and means for correlating said stored first and second signals with a predetermined viewer selection.

10. Apparatus as recited in claim 9 wherein said means for identifying said viewer entered selection includes
sensor means for identifying an operational mode of the monitored receiver, means for comparing said first received predetermined control signals with said stored first predetermined control signals and means for identifying said correlated predetermined viewer selection.

11. Apparatus as recited in claim 10 wherein said predetermined viewer selections include
a turn ON selection,
and wherein said processor means includes means responsive to said identified viewer entered selection to identify the tuned channel,
means for storing a power-off default channel,
sensor means for detecting power off to the monitored receiver, and
means responsive to both said identified turn ON selection and said detected power off for identifying said stored power-off default channel.

12. Apparatus as recited in claim 10 wherein said predetermined viewer selections include
a turn OFF selection and
wherein said processor means includes means responsive to said identified viewer entered selection to identify the tuned channel,
means responsive to said identified turn OFF selection for identifying the current channel, and
means responsive to said identified current channel for storing a last on channel.

13. Apparatus as recited in claim 12 wherein said means responsive to said identified viewer entered selection to identify the tuned channel and means for generating a second unique predetermined control signal for each of said identified viewer entered selections include
means responsive to said identified turn ON selection for identifying said stored last on channel.

14. Apparatus as recited in claim 10 wherein said processor means includes means responsive to said identified viewer entered selection to identify the tuned channel, and
means for correlating and storing each of the plurality of predetermined channels to which the monitored receiver is tuned with said stored first and second signals.

15. Apparatus as recited in claim 1 further including means coupled to said processor means for determining if said first received predetermined signal is one of a predetermined set of said viewer entered selections.

16. A method for identifying the channel to which a monitored remotely controlled receiver is tuned comprising the steps:
receiving one of a plurality of viewer entered selections;
transmitting a first unique predetermined control signal by wireless transmission in response to said received one of said viewer entered selections;
receiving said transmitted first predetermined control signals;
processing said first received predetermined control signals to identify said viewer entered selection;
identifying the channel corresponding to said identified viewer entered selection;
generating a second predetermined control signal representative of said identified viewer entered selection; and
radiating by wireless transmission said generated second predetermined control signal to said remotely controlled receiver.

17. A method as recited in claim 16 further comprising the step of:
storing said identified tuned channel.

18. A method as recited in claim 16 further comprising the steps of:
identifying a current time reference responsive to said identified tuned channel; and
storing said identified tuned channel with said identified current time reference.

19. A method as recited in claim 16 further comprising the steps of:
identifying a satellite selection from a plurality of broadcasting satellites, in response to said identified viewer selection; and
storing said identified satellite selection.

20. A method as recited in claim 16 wherein said steps of processing said first received predetermined control signals and identifying the tuned channel responsive to said identified viewer entered selection includes the steps of:
storing said first and second predetermined control signals for each of said plurality of viewer entered selections;
correlating said stored first and second predetermined control signals with a corresponding viewer entered selection;
storing each of the plurality of predetermined channels of the monitored receiver with corresponding stored first and second signals;
identifying an operational mode of the monitored receiver; and
comparing said first received predetermined control signals with said stored first predetermined control signals responsive to said identified operational mode.

21. A method as recited in claim 20 further including the steps of:
storing a power-off default channel;
identifying a turn ON viewer entered selection;
detecting a power source outage to the monitored receiver; and
identifying said stored power-off default channel responsive to both said identified turn ON selection and said detected power off.

22. A method as recited in claim 20 further including the steps of:
identifying a turn OFF viewer entered selection;
identifying the current channel responsive to said identified turn OFF selection; and
storing a last on channel responsive to said identified current channel.

23. The method of claim 16 wherein said predetermined control signals are radiated by ultrasound radiation.

24. The method of claim 16 wherein said predetermined control signals are radiated by infrared radiation.

25. Apparatus for identifying the channel to which a remotely controlled receiver is tuned comprising:
first wireless transmitter means for receiving a plurality of viewer entered selections and for transmitting a first predetermined control signal for each of said viewer entered selections;
receiver means for receiving said transmitted first predetermined control signals;

sensor means for identifying an operational mode of the monitored receiver;

processor means coupled to said receiver means for processing said first received predetermined control signals, said processor means including means for storing each of said first predetermined control signals, means for correlating each of said stored first predetermined control signals with a predetermined second control signal, said second control signals having a predefined format for controlling the monitored receiver, means responsive to said processed signal for identifying said viewer entered selection, means responsive to said identified viewer entered selection to identify the tuned channel, and means for identifying said second predetermined control signal corresponding to said identified viewer entered selection and;

second wireless transmitter means coupled to said processor means for receiving and transmitting said identified second predetermined control signal to said monitored receiver.

26. The apparatus of claim 25 wherein said first and second wireless transmitter means includes means for transmitting said first and said second predetermined control signals by ultrasound radiation.

27. The apparatus of claim 25 wherein said first and second wireless transmitter means includes means for transmitting said first and said second predetermined control signals by infrared radiation.

28. Apparatus for non-invasively monitoring a remotely controlled receiver that is responsive to signals radiated by wireless transmission to determine the channel to which the receiver is tuned, comprising:

means responsive to a viewer entered channel selection for transmitting a signal radiated by wireless transmission representative of the viewer entered selection; and means responsive to the radiated signal for determining and logging the channel selection entered by the viewer and transmitting a second signal radiated by wireless transmission to said receiver representative of the viewer entered selection to tune the receiver to the channel selected by the viewer.

29. The apparatus of claim 28 wherein said apparatus includes means for transmitting said radiated signals by infrared radiation.

30. The apparatus of claim 28 wherein said apparatus includes means for transmitting said radiated signals by light radiation.

31. The apparatus of claim 28 wherein said apparatus includes means for transmitting said radiated signals are transmitted by ultrasound radiation.

32. The apparatus of claim 28 wherein said first radiated signal has a code different than said second radiated signal.

33. A method for non-invasively monitoring a remotely controlled receiver that is responsive to signals radiated by wireless transmission to determine the channel to which the receiver is tuned, comprising the steps of:

radiating by wireless transmission a first signal representative of a viewer entered channel selection;

determining and logging the channel selection entered by the viewer; and radiating by wireless transmission a second signal representative of the viewer entered selection to said receiver to tune the receiver to the channel selected by the viewer.

34. The method of claim 33, wherein said signals are radiated by infrared.

35. The method of claim 33, wherein said signals are radiated by ultrasound.

36. The method of claim 33, wherein said signals are radiated by light.

37. The method of claim 33, wherein said first signal has a code different than said second signal.

38. The method of claim 33, wherein said first signal is radiated in a different medium than said second radiated signal.

* * * * *